United States Patent [19]

Eckardt et al.

[11] Patent Number: 4,972,146
[45] Date of Patent: Nov. 20, 1990

[54] SATURBLE CORE DEVICE WITH DC COMPONENT ELIMINATION FOR MEASURING AN EXTERNAL MAGNETIC FIELD

[75] Inventors: Dieter Eckardt, Nürnberg; Gerhard Hettich, Dietenhofen, both of Fed. Rep. of Germany

[73] Assignee: Robert Bosch GmbH, Stuttgart, Fed. Rep. of Germany

[21] Appl. No.: 347,778

[22] PCT Filed: Aug. 6, 1987

[86] PCT No.: PCT/DE87/00346
§ 371 Date: Apr. 21, 1989
§ 102(e) Date: Apr. 21, 1989

[87] PCT Pub. No.: WO88/03654
PCT Pub. Date: May 19, 1988

[30] Foreign Application Priority Data

Jun. 11, 1986 [DE] Fed. Rep. of Germany ....... 3637801

[51] Int. Cl.$^5$ ............................................. G01R 33/04
[52] U.S. Cl. .................................... 324/253; 324/255
[58] Field of Search ........................ 324/249, 253–255; 33/361; 340/870.33; 307/358

[56] References Cited

U.S. PATENT DOCUMENTS

| | | | |
|---|---|---|---|
| 3,983,475 | 9/1976 | Watanabe et al. | 324/254 |
| 4,007,417 | 2/1977 | Takeuchi et al. | 324/249 |
| 4,290,018 | 9/1981 | Rhodes | 324/255 |
| 4,303,886 | 12/1981 | Rhodes | 324/255 |
| 4,305,035 | 12/1981 | Mach et al. | 324/255 |
| 4,321,536 | 3/1982 | Rhodes | 324/253 |
| 4,339,727 | 7/1982 | Kage et al. | 307/358 X |
| 4,677,381 | 6/1987 | Geerlings | 324/254 X |
| 4,733,181 | 3/1988 | Bauer | 324/253 |

FOREIGN PATENT DOCUMENTS 0155324 9/1985 European Pat. Off. .
1234848 2/1967 Fed. Rep. of Germany .

*Primary Examiner*—Gerard R. Strecker
*Attorney, Agent, or Firm*—Michael J. Striker

[57] ABSTRACT

A device for measuring a magnetic field which is constant or varies over time, includes at least one core (3, 4) consisting of a material having high permeability, a coil (5, 6) for the magnetization of this core via an alternating current source (I) connected to the coil, and at least one measuring coil (7, 8) in which a voltage is induced corresponding to the magnetic field resulting in the coil produced by means of the applied alternating current and the external magnetic field to be measured. In order to measure very small magnetic fields and relative changes in the fields, an integrating device (9) connected with the measuring coil (7, 8), an arrangement for subtracting the d.c. voltage component from the alternating voltage component of the measurement voltage ($U_{ai}$) and a device for detecting the peak values of consecutive half-waves of the output signal ($U_x$) of the subtracting arrangement (13, 10) are provided.

7 Claims, 4 Drawing Sheets

SATURBLE CORE DEVICE WITH DC COMPONENT ELIMINATION FOR MEASURING AN EXTERNAL MAGNETIC FIELD

The invention is directed to a device for measuring an external magnetic field which is constant or varies over time, comprising at least one core consisting of a material having high permeability, a coil for the magnetization of this core via an alternating current source connected to the coil, and a measuring coil in which a voltage is induced corresponding to the magnetic field resulting in the coil produced by means of the applied alternating current and the external magnetic field to be measured.

Such a device is known from the DE-OS No. 33 45 712. In this known device, which serves particularly for measuring the direction of the earth's field, the core is saturation magnetized by means of an alternating current. In so doing, the degree of deviation between the period of the positive and negative half-waves of the measurement voltage forms a measure for the magnitude of the measured magnetic field in that, because of the external magnetic field to be measured, the core reaches the saturation region earlier in one magnetization direction and later in the other direction than it would without an external magnetic field. Accordingly, the measurement of the magnetic field can ultimately be reduced to a measurement of the pulse width repetition rate, i.e. the ratio of the period of the positive amplitude to the period of the negative amplitude, wherein the actual value of the magnetic field to be measured is derived from this pulse width repetition rate by means of a microcomputer.

In another known comparable device, the so-called "Foerster probe", the frequency spectrum is taken as criterion, which requires selective and expensive filters. The amplification is limited due to the filtering and various nonlinearities.

The invention has the object of constructing a device of the above mentioned type in such a way that a particularly high sensitivity is achieved, so that small changes in magnetic fields can be determined in particular.

SUMMARY OF THE INVENTION

This object is met, according to the invention, by means of an integrating device connected to the measuring coil, an arrangement for the subtraction of the direct current component or quasi-direct current component of the output voltage of the integrating device, and a device for detecting the maximum values of consecutive half-waves of the output signal ($U_x$) of the subtraction arrangement.

In conformity with the prior art according to DE-OS No. 33 45 712, a distortion of the half-waves of the measurement voltage effected by means of the magnetization curve (hysteresis) and the steady field acting from the outside is investigated also in the solution according to the present invention. However, it is not the difference between the time points of the saturation magnetization which is derived from this distortion but, rather, by eliminating d.c. components the distortion of the measurement curves due to the external field itself, is determined. Since the measured signals contain no d.c. component, an extremely high sensitivity, which is limited only by the noise of the utilized amplifier, can be achieved by means of amplifying the integrated signal. This enables a wide measuring range and a high sensitivity at low cost. Moreover, one or more compensation coils can compensate for an external basic magnetic field such as the geomagnetic field in a relatively simple manner, so that very small relative changes in the magnetic field can also be determined in a particularly favorable manner as is desirable e.g. when used for sensors for moving metal parts or in the examination of soil in archeology or geology.

In a favorable embodiment form it is provided that a device for forming the difference of the maximum values of two consecutive half-waves comprises a switching device operating in dependence on the sign of the applied voltage, a sample-and-hold arrangement connected to every switching output of the switching device, and an adding device connected to the outputs of the sample-and-hold arrangement.

According to another advantageous embodiment form it is provided that identical, but oppositely wound, measuring coils are connected in series for forming the measuring voltage and that they are connected with the integrating device, the device for forming the subtraction of the d.c. voltage component from the alternating voltage component being connected to the output of the integrating device. This possibility for achieving two opposed measuring voltages can be realized in such a way that the measuring coils with opposite winding directions can be applied and connected in series on one and the same core or in such a way that two complete coil/core arrangements can be used and connected in series.

In a particularly simple construction, the subtracting device comprises a low-pass filter and a difference amplifier whose one input is connected directly with the output of the integrating device and whose other input is connected via a low-pass filter with the output of the integrating device.

In order to carry out relative measurements and in order to compensate for an external interference field, it has proven advantageous to connect a control arrangement with the output of the subtraction device, the output of the control device being connected with a compensation coil arranged on the core. The measurement signal can be adjusted to zero during static output conditions by means of this. In principle, it is also possible to compensate manually for the output signal instead of using a control device.

Other features, advantages and particulars of the invention follow from the following description of a preferred embodiment form with the aid of the drawing.

DESCRIPTION OF THE PREFERRED EMBODIMENTS

Figure 1:
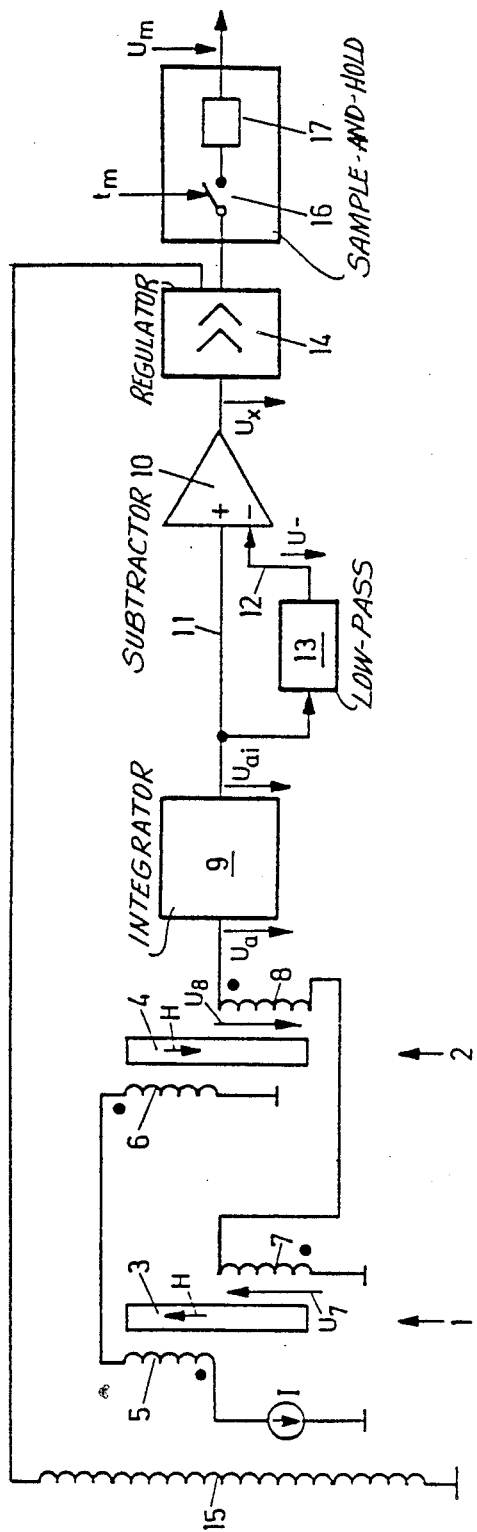
FIG. 1 shows a schematic block wiring diagram of a first embodiment form of a device, according to the invention.

In the embodiment form shown in FIG. 1, two measuring probes 1, 2 are provided, each of which comprises a core 3 or 4 of a material having high permeability, e.g. of amorphous metals, as well as a magnetizing coil 5 or 6 for applying an alternating current, and a measuring coil 7 or 8. The coils 5, 6 of the two probes 1, 2 are connected in series in such a way that the same exciting alternating current I of e.g. 1 kHz flows through both. The coils 7, 8, which are identical to one another, are connected in series with opposite winding directions, so that an arrangement for forming the difference of the values of the two half-waves of the alternating voltages U7 and U8 is formed by means of this.

The resulting measurement current and the corresponding measurement voltage $U_a$ is fed to an integrating device 9. The integrating device 9 serves to derive the magnetic flux $\Phi$ from the measurement voltage $U_a$ which is obtained by induction in the measuring coils 7, 8 and which is proportional to the time derivative of the magnetic flux $\Phi$ to be measured.

The output signal $U_{ai}$ of the integrating device 9 is applied directly to an input of a difference amplifier 10 via a line 11, and the same signal after filtering by means of a low-pass filter 13 is applied via a line 12 to another input of the amplifier. Accordingly, only signals without d.c. components occur at the output of the difference amplifier 10 and can be amplified by means of amplifier devices, not shown in detail. The output signal $U_x$ of the difference amplifier 10 is fed to a regulating device 14 whose output is connected with a compensation coil 15. During the measurement of relative changes in the field strengths, the regulating device 14 serves to compensate for an existing magnetic basic field such as e.g. the earth's field or a low-frequency interference field such as produced by electrically driven trains and the like (16⅔ Hz). The regulating device 14 has a regulating constant such that readjustment of the compensation by means of the compensation coil 15 is effected in a clearly slower manner than the relative field changes to be measured.

A control device 16 for the sampling time points $t_m$ of the measurement values and an analog storage 17 for the storage and output of the measurement signal are connected to the output of the regulating device 14. A maximum of measuring accuracy is achieved by controlling the selection of the sampling time points $t_m$ by means of the control device 16 at the peak values of the measurement signal $U_a$ after the formation of the difference of the values of the two half-waves of the signals U7 and U8, and the rectifier devices can be dispensed with.

Figure 2:
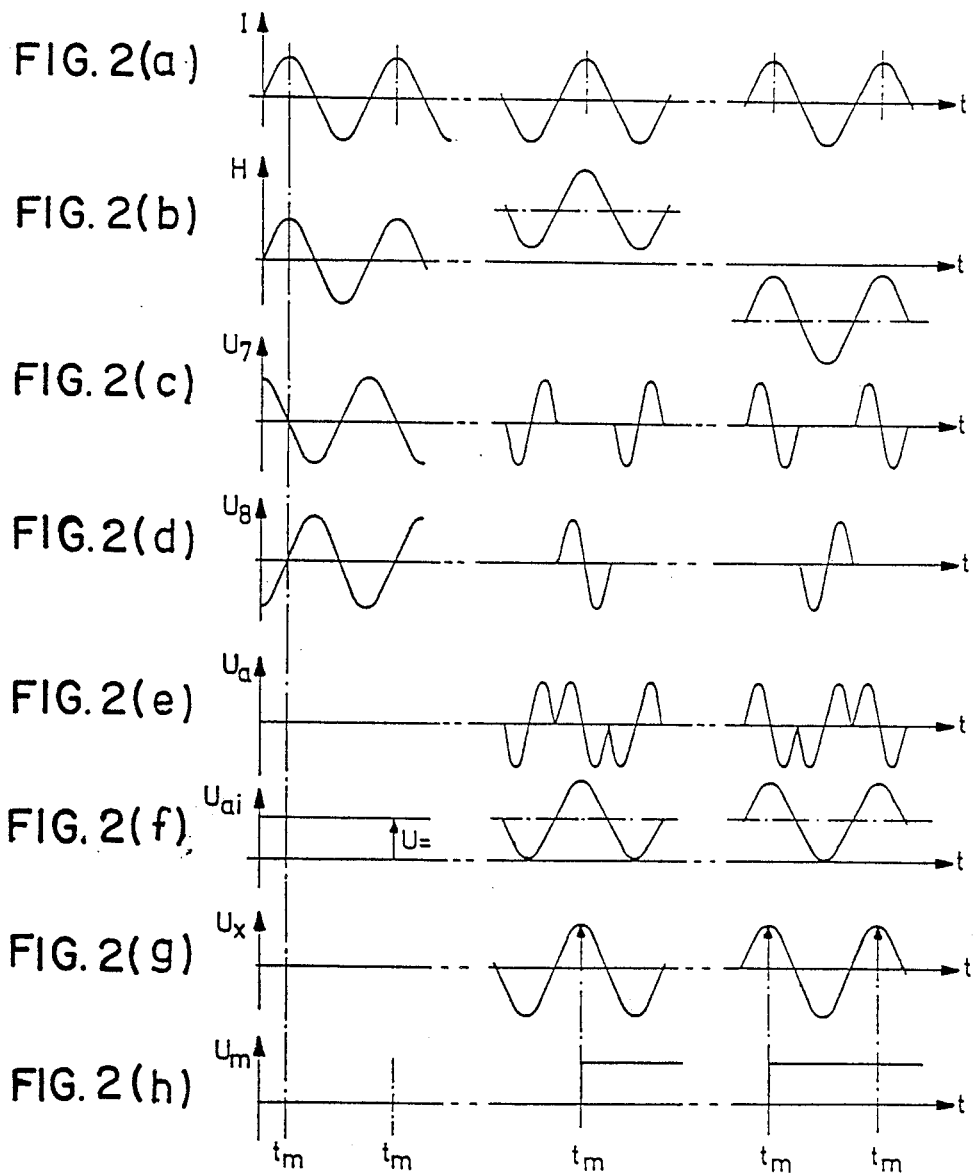
FIGS. 2a–2h show the curve of the measurement voltages and their transformation and evaluation in the first embodiment form.

In FIG. 2, the signal $U_a$ curve is shown as a function of time at various points of the circuit shown in FIG. 1 in order to illustrate the manner of operation of the device, according to the invention. There is no field to be detected in the first portion; in the second portion a field is superposed on the sinusoidal field in the positive direction and in the third portion a field is superposed on the sinusoidal field in the negative direction.

The curve of the exciting current I in coils 5 and 6 is shown in FIG. 2a as a function of time.

The field strength H is the magnetic cores 3 and 4 is shown in FIG. 2b.

The curve of the induced voltages U8 and U7 in the coils 7 and 8, which volgages U8 and U7 are out of phase by 180 degrees, is shown in FIGS. 2c and 2d, wherein the sinusoidal curves from FIG. 2a are distorted by means of the superposition of the external steady field to be measured in the saturation region of the cores 3 and 4.

A measurement signal $U_a$ of the form shown in FIG. 2e is obtained by means of the series connection of the measuring coils 7, 8 which are wound in opposite directions, which measurement signal $U_a$ is applied to the input of the integrating device 9.

In FIG. 2f, the integrating signal $U_{ai}$ occurs, whose direct current component U= at the output of the integrator 9 is filtered out by the low-pass filter and applied as U− to the inverting input of the difference amplifier 10.

The output signal $U_x$ of the difference amplifier 10 is shown in FIG. 2g.

As shown in FIG. 2h, the measurement value $U_m$ is detected at time $t_m$ and is stored until the next measurement. The time $t_m$ is determined in this instance by means of the peak value of the exciting alternating current I according to FIG. 2a.

Sensitivities in the order of magnitude of 1pT are achieved with the probe, according to the invention, by means of preventing d.c. components in the output signal $U_x$, and the sensitivity is limited only by the noise of the amplifiers.

Figure 3:
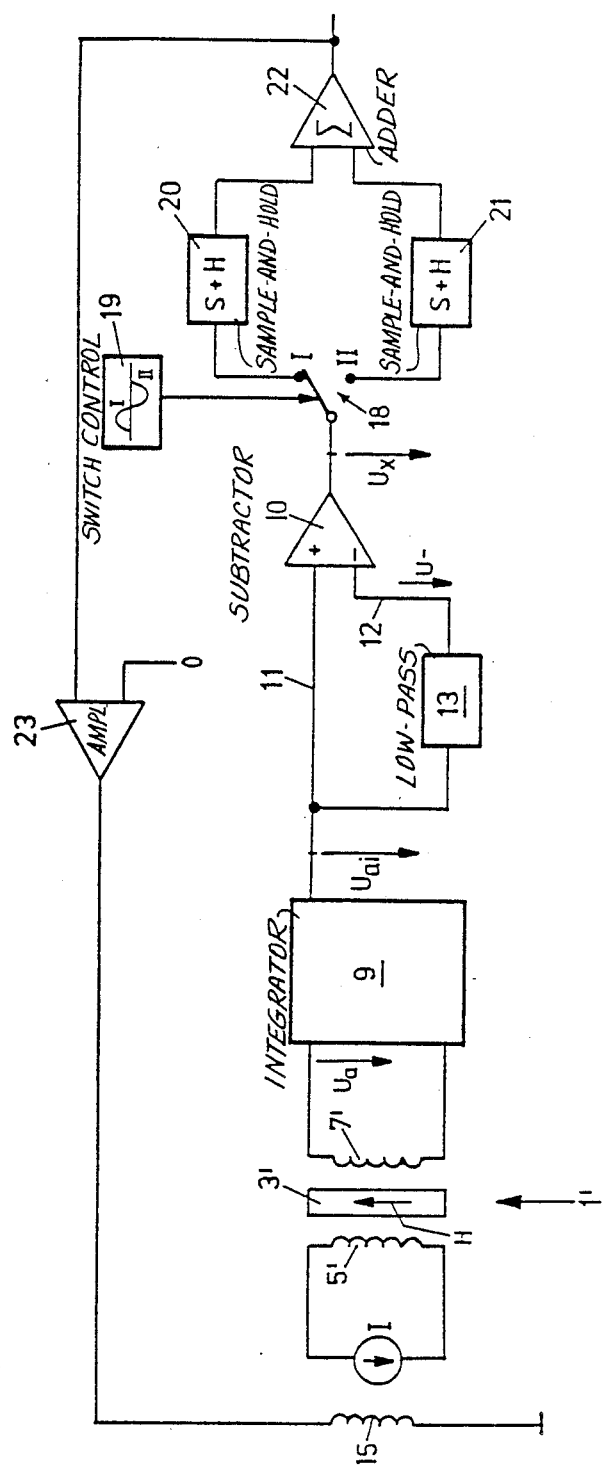
FIG. 3 shows a schematic block wiring diagram of a second embodiment form of a device, according to the invention.

In the embodiment form shown in FIG. 3, only one measuring probe 1' is provided which comprises a core 3' consisting of a material of high permeability, and a coil 5' for applying an alternating current I and a measuring coil 7'.

As in the embodiment example according to FIG. 1, an integrating device 9 is connected with the measuring coil 7'1. As in the embodiment example according to FIG. 1, the output signal $U_{ai}$ of the integrating device 9 is fed to the inputs of a difference amplifier 10 directly via a line 11 and via a low-pass filter 13 in line 12, a switch 18 being connected to the output of the amplifier 10. The switch 18 comprises two switching positions I and II, wherein the switch 18 is actuated by a switching arrangement 19 in such a way that it is brought into switching position I during a positive half-wave of the input voltage and into switching position II during a negative half-wave of the input voltage.

A sample-and-hold arrangement 20, 21 is connected to the contacts of the switch 18, which correspond to switching positions I and II, respectively, the sample-and-hold arrangement being designed in such a way that it determines the peak value of the consecutive half-waves fed to it in each instance, and the difference value ($U_m$) of the two half-wave peak values having opposite signs is formed in the subsequent adding device 22.

The output signal of the adding device 22 is made use of for driving a compensation coil 15—as in the front embodiment example—via a driver stage 23 in such a way that an external magnetic field which is constant or changes slowly over time relative to the measurement frequency is compensated to zero. The time constant of the compensation control is designed or adjusted in such a way that changes in the magnetic field, which are comparatively rapid and which are to be measured, are not compensated for.

FIG. 4 illustrates the curve of the voltage at various points of the circuit arrangement shown in FIG. 3.

Figure 4A:
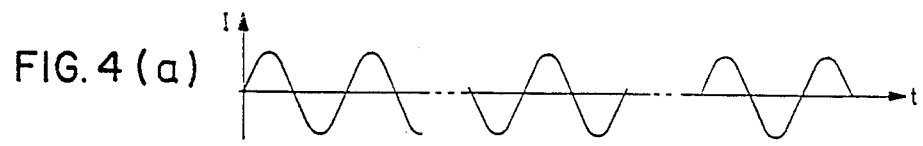
FIGS. 4a–4f show the curve of the characteristic voltages in the second embodiment form.

FIG. 4a shows the curve of the exciting alternating current I of 1 kHz in the coil 5' corresponding to the curve in FIG. 2a.

Figure 4B:
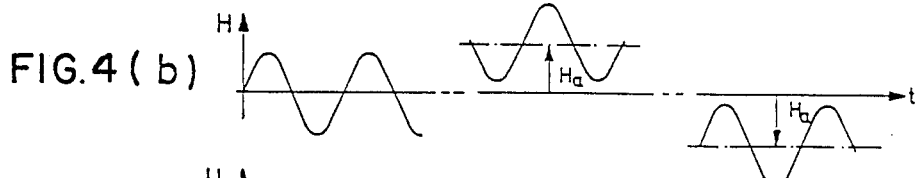

FIG. 4b shows the curve of the field strength H which illustrates that the positive and negative half-wave is shifted from the zero line or base level by means of the superposition of an external magnetic field $H_a$.

Figure 4C:
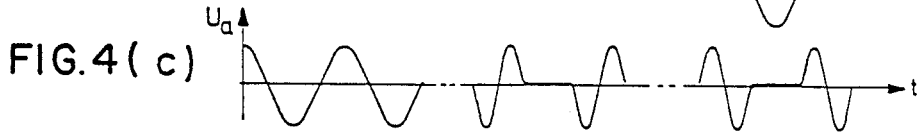

FIG. 4c shows the voltage Ua induced in the measuring coil 7', which voltage Ua results by means of the core saturation without or during superposition of an external magnetic field Ha.

Figure 4D:
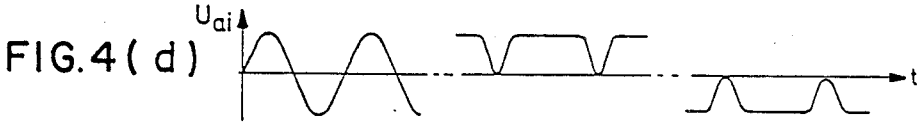

The voltage $U_{ai}$ at the output of the integrating device 9, from which the d.c. component must still be filtered, is shown in FIG. 4d.

Figure 4E:
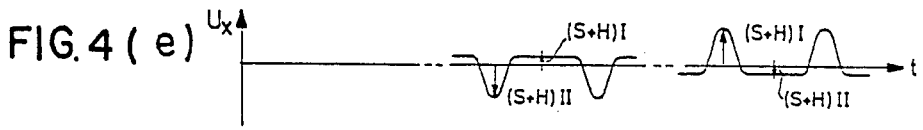

FIG. 4e shows the voltage $U_x$ at the output of the difference amplifier 10 without d.c. component. Further, FIG. 4e shows how the sample-and-hold devices 20 and 21 detect and store a peak value in switching position I and II, respectively, of the switch 18.

Figure 4F:
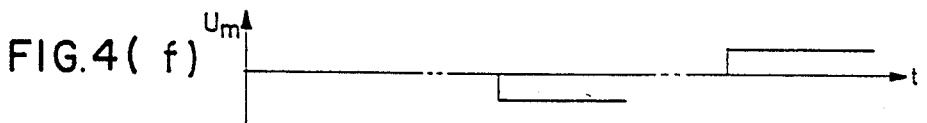

FIG. 4f shows the output signal $U_m$ at the output of the adding device 22, while the two peak measurement values of the sample-and-hold devices 20 and 21 being fed to the inputs of the adder 22. This output signal $U_m$ serves on the one hand as a compensation signal for the compensation coil 15 for slow changes in the field or for interference fields and on the other hand constitutes the measurement signal proportional to the magnetic field to be measured after the comparison has been achieved.

We claim:

1. Device for measuring an external magnetic field comprising two cores consisting of a material having high permeability; two magnetizing coils connected in series one to another and to a source of alternating current and each being coupled to an assigned core to magnetize the same; two measuring coils connected in series one to another and each being coupled to an assigned core and being exposed to the external magnetic field to be measured; and integrating device connected at its input with the measuring coils to integrate a measurement voltage ($U_a$) induced in the measuring coils due to the combined alternating magnetic field in the cores generated by the magnetizing coils, and the external magnetic field to be measured, and producing an integrated voltage ($U_{ai}$) at its output; separating means having an input connected to the output of the integrating device for separating a direct current component (U=) from the integrated voltage ($U_{ai}$); a subtracting device connected with the output of the integrating device and the output of the separating means to subtract the direct current component (U=) from the integrated voltage ($U_{ai}$) and to produce an output signal ($U_x$) devoid of the direct current component; a regulating device connected to the output of the subtracting device, an output of the regulating device being connected with a coil for compensating a steady field in said cores; and another output of the regulating device being connected to a device for controlling the selection of sampling time points ($t_m$) at the peak values of the measurement voltage ($U_a$).

2. Device according to claim 1, wherein two identical measuring coils oppositely wound on the assigned cores, are connected in series to the input of the integrating device.

3. Device for measuring an external magnetic field, comprising at least one core consisting of a material having high permeability; a magnetizing coil connected to a source of alternating current and being coupled to said core to magnetize the same; a measuring coil coupled to said core and being exposed to the external magnetic field to be measured; an integrating device connected at its input with the measuring coil to integrate a voltage ($U_a$) induced in the measuring coil due to the combined alternating magnetic field in the core generated by the magnetizing coil, and the external magnetic field to be measured, and producing an integrated voltage ($U_{ai}$) at its output; separating means having an input connected to the output of the integrating device for separating a direct current component (U=) from the integrated voltage ($U_{ai}$); a subtracting device connected with the output of the integrating device and the output of the separating means to subtract the direct current component (U=) from the integrated voltage ($U_{ai}$), and to produce an output signal ($U_x$) devoid of the direct current component connected to the subtracting device; and a device for detecting the maximum values of consecutive half-waves of the output signal ($U_x$).

4. Device according to claim 3, wherein the detecting device includes means for forming the difference of the maximum value of two consecutive half-waves.

5. Device according to claim 4, wherein the difference forming means includes a two-position switching device which operates in dependency on the sign of the half-waves of the output signal ($U_x$) to deliver the positive half-waves to one switching output and the negative half-waves to another switching output, a sample-and-hold device connected to each switching output of the switching device, and an adder connected to the outputs of respective sample-and-hold devices.

6. Device according to claim 5, further comprising a coil for compensating a steady field in said core and a driving stage having an input connected to an output of the adder and an output connected to the compensating coil.

7. Device according to claim 3, wherein the separating means includes a low-pass filter, and the subtracting device includes a difference amplifier whose non-inverting input is directly connected to the output of the integrating device and whose inverting input is connected to the output of the integrating device via the low-pass filter.

* * * * *